(12) United States Patent
Arman et al.

(10) Patent No.: US 7,263,841 B1
(45) Date of Patent: Sep. 4, 2007

(54) SUPERCONDUCTING MAGNET SYSTEM WITH SUPPLEMENTARY HEAT PIPE REFRIGERATION

(75) Inventors: Bayram Arman, Grand Island, NY (US); Arun Acharya, East Amherst, NY (US); Richard C. Fitzgerald, Grand Island, NY (US); James J. Volk, Clarence, NY (US)

(73) Assignee: Praxair Technology, Inc., Danbury, CT (US)

( * ) Notice: Subject to any disclaimer, the term of this patent is extended or adjusted under 35 U.S.C. 154(b) by 296 days.

(21) Appl. No.: 10/804,029

(22) Filed: Mar. 19, 2004

(51) Int. Cl.
*F25B 19/00* (2006.01)
*F25B 9/00* (2006.01)
*F25D 23/12* (2006.01)

(52) U.S. Cl. ............... 62/51.1; 62/6; 62/259.2
(58) Field of Classification Search .......... 62/51.1, 62/259.2, 6
See application file for complete search history.

(56) References Cited

U.S. PATENT DOCUMENTS

| | | | |
|---|---|---|---|
| 3,882,687 A * | 5/1975 | Asztalos et al. | 62/50.5 |
| 3,884,296 A * | 5/1975 | Basiulis | 165/96 |
| 3,892,273 A * | 7/1975 | Nelson | 165/104.26 |
| 4,680,936 A * | 7/1987 | Sarwinski et al. | 62/45.1 |
| 4,782,671 A * | 11/1988 | Breneman et al. | 62/51.1 |
| 4,924,198 A | 5/1990 | Laskaris | 335/216 |
| 5,461,873 A * | 10/1995 | Longsworth | 62/51.1 |
| 5,701,744 A * | 12/1997 | Eckels et al. | 62/47.1 |
| 6,038,867 A * | 3/2000 | Einziger et al. | 62/45.1 |
| 6,107,905 A * | 8/2000 | Itoh et al. | 335/216 |
| 6,374,617 B1 | 4/2002 | Bonaquist et al. | 62/6 |
| 6,640,553 B1 | 11/2003 | Kotsubo et al. | 62/6 |
| 6,644,038 B1 | 11/2003 | Acharya et al. | 62/6 |
| 6,807,812 B2 * | 10/2004 | Lehmann et al. | 62/47.1 |

OTHER PUBLICATIONS

Ackermann et al., "Advanced Cryocooler Cooling for MRI Systems", Cryocoolers 10 (1999) pp. 857-867.
Ackermann et al., "Cryogenic Refrigerator Evaluation for Medical and Rotating Machine Applications", Cryocoolers 12 (2003) pp. 805-811.

* cited by examiner

*Primary Examiner*—William C Doerrler
(74) *Attorney, Agent, or Firm*—David M. Rosenblum

(57) ABSTRACT

A superconducting magnet system wherein a cryocooler provides refrigeration to a cryogenic shield for the superconducting magnet and a heat pipe extends from the cryogenic shield to a cryogen vessel for the provision of supplementary refrigeration.

10 Claims, 3 Drawing Sheets

SUPERCONDUCTING MAGNET SYSTEM WITH SUPPLEMENTARY HEAT PIPE REFRIGERATION

TECHNICAL FIELD

This invention relates generally to refrigeration and, more particularly, to refrigeration for a superconducting magnet as may be employed in conjunction with a magnetic resonance imaging system.

BACKGROUND ART

Magnetic resonance imaging systems require the use of a superconducting magnet which must be kept at a very cold temperature to ensure superconducting conditions. A failure of the system supplying refrigeration to the superconducting magnet results in thermal cycling which is not only costly and potentially damaging but also compromises the integrity of the imagery produced by the magnetic resonance imaging system.

Accordingly it is an object of this invention to provide a superconducting magnet system such as may be employed with a magnetic resonance imaging system which has greater refrigeration reliability than heretofore available systems.

SUMMARY OF THE INVENTION

The above and other objects, which will become apparent to those skilled in the art upon a reading of this disclosure, are attained by the present invention which is:

A superconducting magnet system comprising:

(A) a superconducting magnet and a cryogenic shield for providing cooling to the superconducting magnet;

(B) a cryocooler positioned to provide refrigeration to the cryogenic shield;

(C) a cryogen vessel containing liquid cryogen; and (D) a heat pipe extending from the cryogen vessel to the cryogenic shield.

As used herein the term "superconducting magnet" means an electromagnet constructed with superconducting wire or tape.

As used herein the term "cryocooler" means a refrigerator capable of producing refrigeration at cryogenic temperatures.

As used herein the term "heat pipe" means a heat transfer device which transports refrigeration from and heat to a cryogen vessel.

Figure 1:
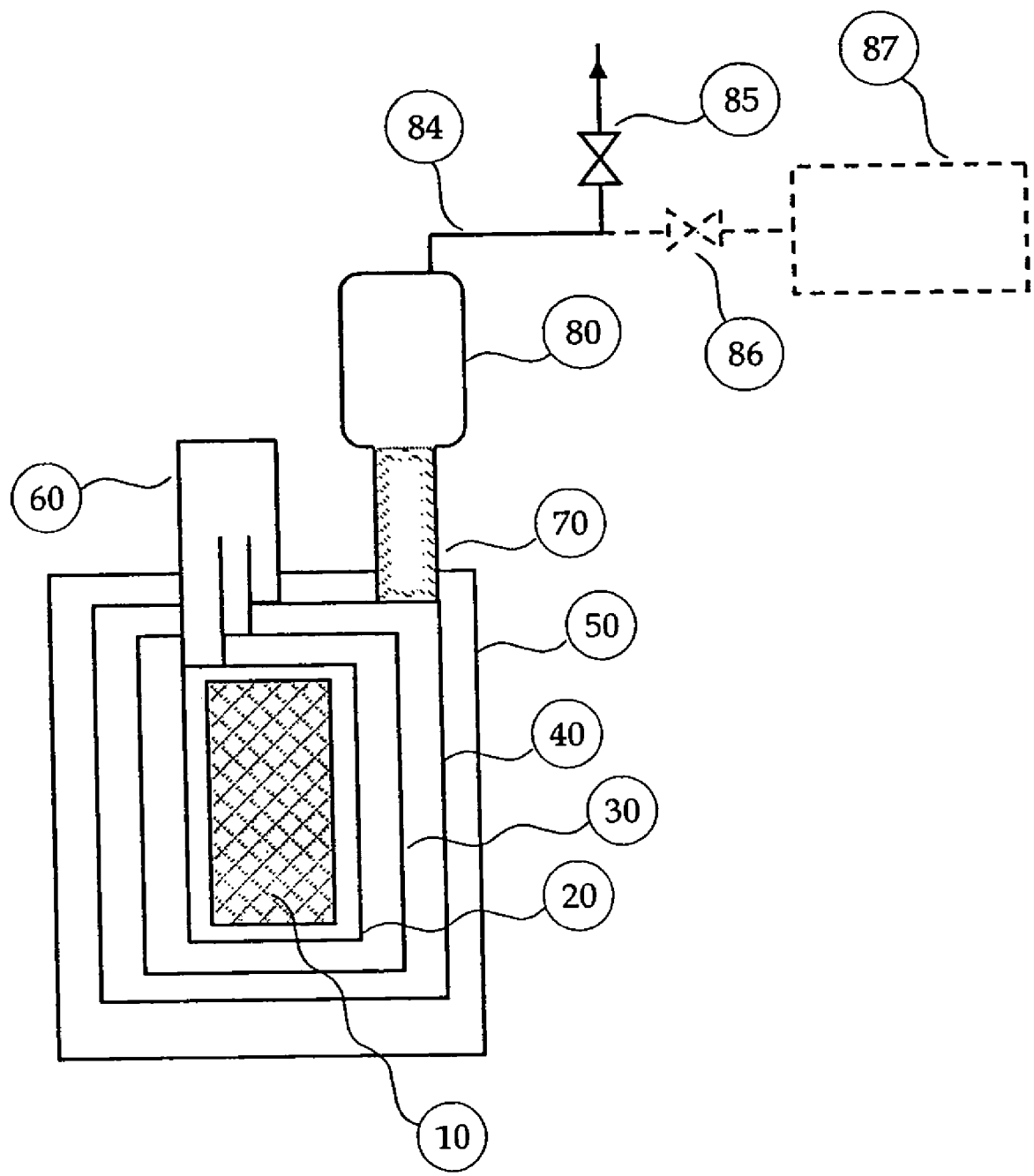
FIG. 1 is a simplified schematic representation of one preferred embodiment of the superconducting magnet system of this invention.

The numerals in the Drawings are the same for the common elements.

DETAILED DESCRIPTION

The invention will be described in detail with reference to the Drawings.

Referring now to FIG. 1, superconducting magnet 10 is immersed in liquid helium in vessel 20. Alternatively superconducting magnet 10 may be conduction cooled rather than being immersed in the liquid helium.

Figure 2:
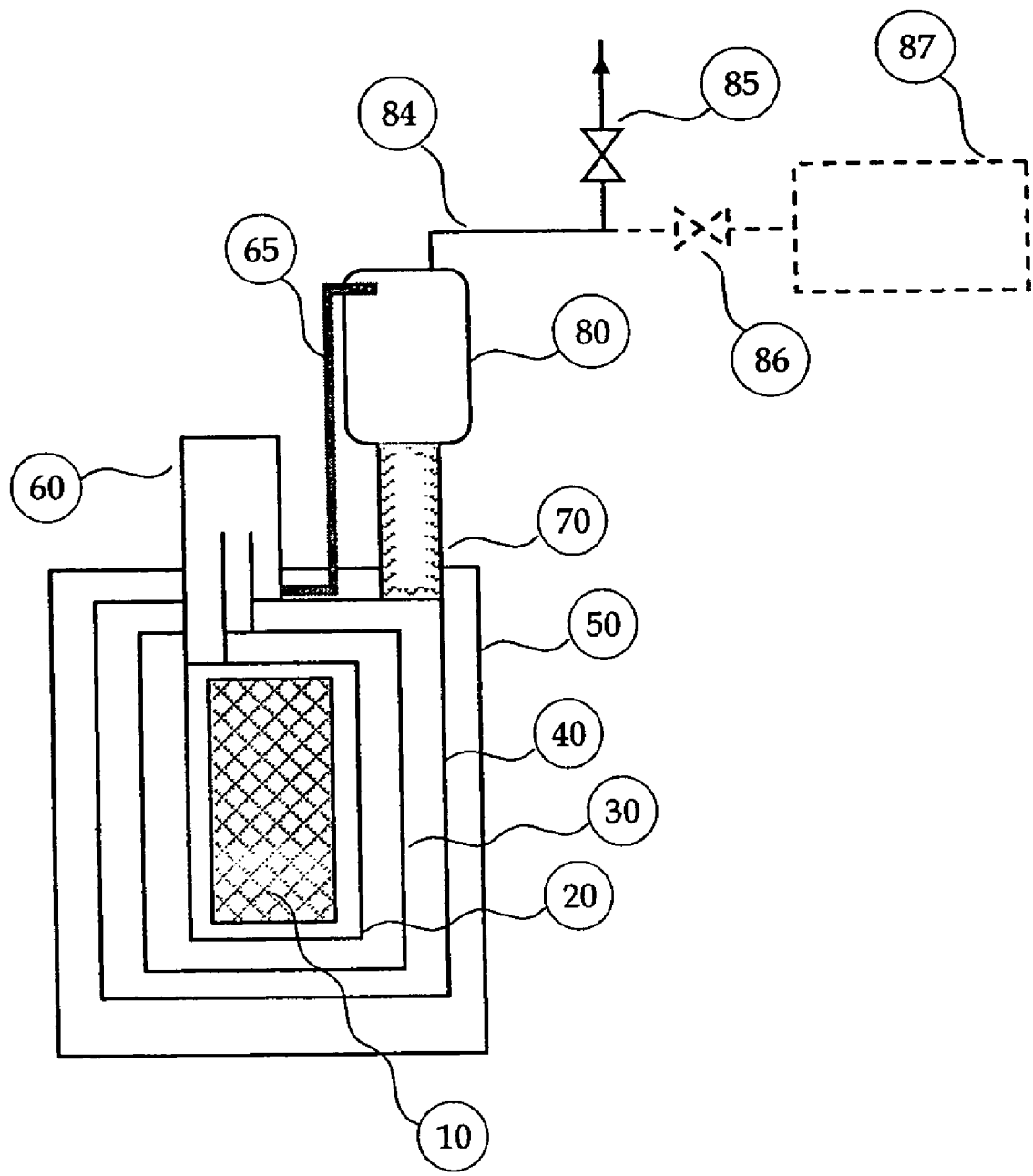
FIG. 2 is a simplified schematic representation of another preferred embodiment of the superconducting magnet system of this invention wherein the cryocooler additionally provides refrigeration to the cryogen vessel.

A cryogenic shield is around the superconducting magnet. Preferably, as illustrated in FIGS. 1 and 2, the cryogenic shield has a plurality of layers including an innermost layer closest to the superconducting magnet and an outermost layer furthest from the superconducting magnet.

In the embodiment of the invention illustrated in FIG. 1 the cryogenic shield comprises three layers which are first shield 40, second shield 30 and vessel 20. First shield 40 is the outermost layer and the outerwall of vessel 20 is the innermost shield layer. Second shield 30 is a middle layer. These shields are located in a chamber 50 with high vacuum to provide insulation.

Cryocooler 60 is positioned to provide refrigeration to the cryogenic shield. In the embodiment of the invention illustrated in FIG. 1, three stage cryocooler 60 provides refrigeration to first shield 40 to keep first shield 40 at a temperature within the range of from 30 to 90 K, provides refrigeration to second shield 30 to keep second shield 30 at a temperature within the range of from 15 to 50 K, and provides refrigeration to vessel 20 so as to maintain the inner vessel boundary of vessel 20 at a temperature within the range of from 4.2 to 35 K. The superconducting magnet and the cryogenic shield are contained in container or chamber 50.

Cryogen vessel 80 contains liquid cryogen 81. Among the liquid cryogens which may be employed in the practice of this invention one can name helium, hydrogen, neon, nitrogen, oxygen and mixtures comprising one or more thereof. Heat pipe 70 extends from cryogen vessel 80 to the cryogenic shield and is employed to deliver refrigeration from the cryogen vessel to the cryogenic shield. In the embodiments illustrated in the Drawings, the heat pipe is shown extending to the outermost layer of the cryogenic shield. It is understood however that the heat pipe could extend to any layer of a multilayer cryogenic shield. For example the heat pipe could extend to the innermost layer of a multilayer cryogenic shield. Moreover, the heat pipe could extend to more than one layer of a multilayer cryogenic shield.

Figure 4:
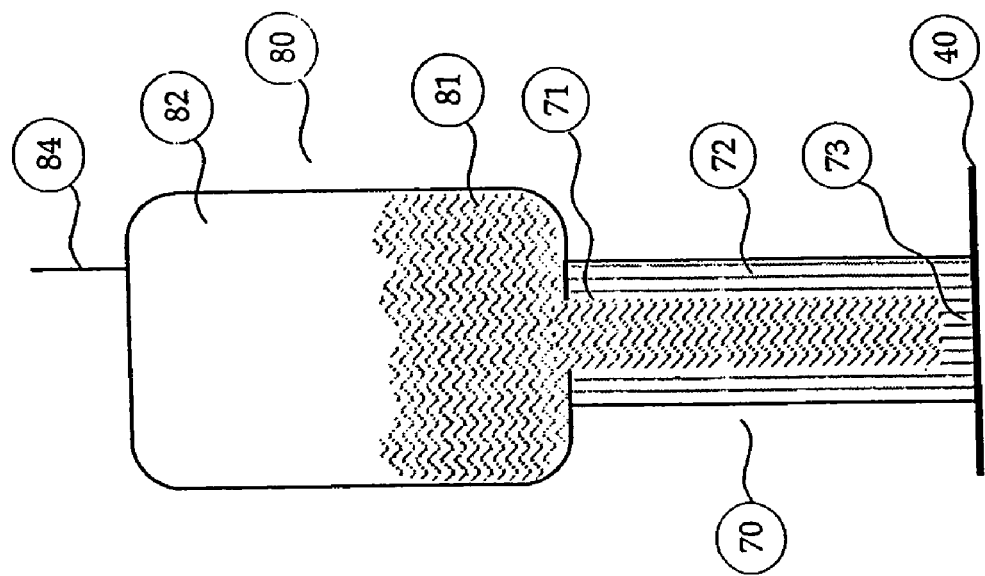
FIG. 4 illustrates another preferred embodiment of a heat pipe which may be used in the practice of this invention.
Figure 3:
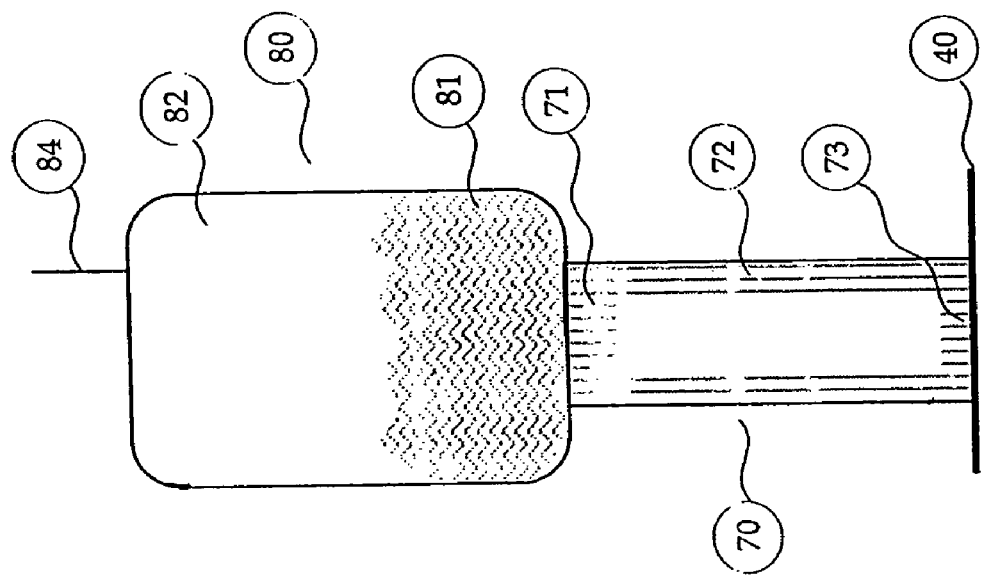
FIG. 3 illustrates one preferred embodiment of a heat pipe which may be used in the practice of this invention.

FIGS. 3 and 4 illustrate details of heat pipe 70 and cryogen vessel 80. Referring now to FIG. 3, there is shown a heat pipe configuration having a stand alone heat pipe with its own heat pipe working fluid with two heat exchange surfaces 71 and 73 at the top and the bottom respectively of the heat pipe. When the shield 40 is cold, i.e. when the cryocooler is running, the heat pipe working fluid is fully condensed. There is only a very small heat transfer relationship between cryogen vessel 80 and shield 40 through the heat pipe wall conduction. When cryocooler 60 is down or otherwise not running, shield 40 warms up and heat pipe working fluid evaporates from lower heat exchange surface 73 and rises to upper heat exchanger 71 where it is condensed by the cold generated by cryogen 81 via conduction through surface 71. The condensed working fluid then flows by gravity through wall structure 72 down to heat transfer surface 73 and refrigeration from the condensed working fluid is passed by conduction through surface 73 to shield 40 and ultimately to the superconducting magnet. This evaporation and condensation cycle continues as long as the cryogenic shield is not being adequately cooled by the cryocooler. FIG. 4 illustrates another embodiment of heat pipe 70 wherein an upper heat exchange surface is not employed. In this embodiment heat pipe 70 and cryogen vessel 80 are in fluid communication and the cryogen is also the heat pipe working fluid which provides refrigeration to the shield by conduction through heat exchange surface 73 in a manner similar to that described above.

During normal operation when the cryocooler 60 is operating, the boil-off from the cryogen is eliminated by slight subcooling of the cryogen within the vessel through the heat pipe 70. The wicking shown in heat pipe wall structure 72 allows proper movement of the liquid. When the cryocooler is not operating, the liquid in heat pipe 70 will start to evaporate thus providing shield cooling. The pressure in vessel 80 will increase, and the cryogen vapor 82 from exit pipe 84 could be captured in recovery vessel 87 by opening valve 86, or could be vented to the atmosphere through valve 85. If the magnet is a liquid helium immersed system, the magnet will still operate during cryocooler outage with the help of the cryogen vessel. One of the shields will be still active and there will be helium boil off (not shown) from vessel 20. If the magnet system is conduction cooled and uninterrupted operation is required, then the cryogen vessel and its heat pipe will keep the magnet operational. If necessary the shield may also be cooled with a second backup cryogen vessel and associated heat pipe system.

FIG. 2 illustrates another preferred embodiment of the invention which shows another way of ensuring zero boil-off from cryogen vessel 80 by use of a vacuum insulated bus bar 65. The numerals in FIG. 2 are the same as those of FIG. 1 for the common elements, and these common elements will not be discussed again in detail. Bus bar 65 is a vacuum insulated high thermal conductivity solid, such as oxygen-free copper, that extends into the vapor space of cryogen vessel 80 and provides refrigeration which condenses vapor generated due to heat leak into the cryogen vessel.

Although the invention has been described in detail with reference to certain preferred embodiments, those skilled in the art will recognize that there are other embodiments of the invention within the spirit and scope of the claims.

The invention claimed is:

1. A superconducting magnet system comprising:
   (A) a superconducting magnet and a cryogenic shield for providing cooling to the superconducting magnet;
   (B) a cryogen vessel containing liquid cryogen; and
   (C) a heat pipe extending from the cryogen vessel to the cryogenic shield, the heat pipe having a wall structure and a working fluid, the wall structure configured such that the working fluid wicks in the wall structure to effect heat transfer from the cryogenic shield to the liquid cryogen within the cryogen vessel thereby to provide further cooling, independently of the cryocooler, from the liquid cryogen within the cryogen vessel to the cryogenic shield;
   (D) a cryocooler in contact with the cryogenic shield but not the cryogen vessel to provide refrigeration direct to the cryogenic shield and therefore the superconducting magnet and indirectly to the liquid cryogen within the cryogen vessel through the heat transfer effected within the heat pipe between the cryogenic shield and the liquid cryogen such that when the cryocooler is operating boil-off of the liquid cryogen is prevented by subcooling the liquid cryogen within the cryogen vessel through the heat pipe and when the cryocooler is not operating the heat transfer from the cryogenic shield to the heat pipe will evaporate the liquid cryogen within the cryogen vessel top provide shield cooling and therefore, the cooling to the superconducting magnet.

2. The superconducting magnet system of claim 1 wherein the superconducting magnet is immersed in liquid helium.

3. The superconducting magnet system of claim 1 wherein the cryogenic shield comprises a plurality of layers, including an innermost layer closest to the superconducting magnet and an outermost layer furthest from the superconducting magnet.

4. The superconducting magnet system of claim 3 wherein the cryogenic shield comprises three layers.

5. The superconducting magnet system of claim 3 wherein the cryocooler is positioned to provide cooling to each of the layers of the cryogenic shield.

6. The superconducting magnet system of claim 3 wherein the heat pipe extends to the outermost layer of the cryogenic shield.

7. The superconducting magnet system of claim 1 further comprising means for providing refrigeration from the cryocooler to the cryogen vessel.

8. The superconducting magnet system of claim 7 wherein the means for providing refrigeration from the cryocooler to the cryogen vessel comprises a bus bar.

9. The superconducting magnet system of claim 1 wherein the heat pipe is in fluid communication with the cryogen vessel.

10. The superconducting magnet system of claim 1 wherein the heat pipe includes an upper heat exchange surface which is in direct heat exchange relation with the cryogen vessel.

* * * * *